(12) United States Patent
Jin et al.

(10) Patent No.: US 11,214,858 B2
(45) Date of Patent: Jan. 4, 2022

(54) MASK PLATE AND MASK SHEET

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Long Jin, Beijing (CN); Fuqiang Tang, Beijing (CN); Chun Chieh Huang, Beijing (CN); Yu Jing, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 888 days.

(21) Appl. No.: 15/780,960

(22) PCT Filed: Nov. 14, 2017

(86) PCT No.: PCT/CN2017/110803
§ 371 (c)(1),
(2) Date: Jun. 1, 2018

(87) PCT Pub. No.: WO2018/205531
PCT Pub. Date: Nov. 15, 2018

(65) Prior Publication Data
US 2020/0270739 A1  Aug. 27, 2020

(30) Foreign Application Priority Data

May 12, 2017 (CN) .......................... 201720528568.X

(51) Int. Cl.
*C23C 14/04* (2006.01)
*C23C 14/24* (2006.01)
*B05C 21/00* (2006.01)

(52) U.S. Cl.
CPC .......... *C23C 14/042* (2013.01); *B05C 21/005* (2013.01); *C23C 14/24* (2013.01)

(58) Field of Classification Search
None
See application file for complete search history.

(56) References Cited

U.S. PATENT DOCUMENTS

2004/0202821 A1* 10/2004 Kim ........................ B32B 3/266
                                                            428/137
2008/0018236 A1*  1/2008 Arai .................... H01L 51/0011
                                                            313/504

(Continued)

*Primary Examiner* — Jethro M. Pence

(57) ABSTRACT

A mask plate and a mask sheet are provided. The mask plate includes a first mask sheet and a second mask sheet, the first mask sheet includes a first mask area located in a middle region of the first mask sheet and first peripheral areas located on both sides of the first mask area in a first direction, a thickness of the first mask area is less than a thickness of the first peripheral areas to form a first concave portion; the second mask sheet includes a second mask area located in a middle region of the second mask sheet and second peripheral areas located on both sides of the second mask area in a second direction, a thickness of the second mask area is less than a thickness of the second peripheral areas to form a second concave portion.

16 Claims, 4 Drawing Sheets

(56) References Cited

U.S. PATENT DOCUMENTS

| | | | |
|---|---|---|---|
| 2010/0267227 A1* | 10/2010 | Ko | B05C 11/00 438/597 |
| 2011/0067630 A1* | 3/2011 | Ko | C23C 14/042 118/721 |
| 2011/0139069 A1* | 6/2011 | Ahn | C23C 14/042 118/504 |
| 2012/0145076 A1* | 6/2012 | Shin | C23C 14/042 118/504 |
| 2014/0150721 A1* | 6/2014 | Oh | H01L 51/0011 118/504 |
| 2014/0326983 A1* | 11/2014 | Yamazaki | H01L 51/5088 257/40 |
| 2015/0034005 A1* | 2/2015 | Ko | B05C 21/005 118/504 |
| 2015/0037928 A1* | 2/2015 | Hirobe | B05B 12/20 438/99 |
| 2015/0047560 A1* | 2/2015 | Kang | C23C 14/042 118/504 |
| 2015/0102329 A1* | 4/2015 | Lee | H01L 51/0011 257/40 |
| 2015/0114287 A1* | 4/2015 | Kim | C23C 14/042 118/504 |
| 2015/0147838 A1* | 5/2015 | Ookawara | H01L 51/0011 438/34 |
| 2015/0165464 A1* | 6/2015 | Baek | H01L 51/0011 118/504 |
| 2016/0168691 A1* | 6/2016 | Takeda | H01L 51/0011 118/504 |
| 2016/0263607 A1* | 9/2016 | Wang | G09G 3/3208 |
| 2016/0322572 A1* | 11/2016 | Chen | C23C 14/042 |
| 2018/0083192 A1* | 3/2018 | Jeong | C23C 16/042 |
| 2018/0209028 A1* | 7/2018 | Li | C23C 14/24 |
| 2019/0003033 A1* | 1/2019 | Bai | C23C 14/042 |

* cited by examiner

MASK PLATE AND MASK SHEET

The application claims priority to the Chinese patent application No. 201720528568.X, filed May 12, 2017, the entire disclosure of which is incorporated herein by reference as part of the present application.

TECHNICAL FIELD

At least one embodiment of the present disclosure relates to a mask plate and a mask sheet.

BACKGROUND

The organic light emitting diode display includes a passive matrix organic light emitting diode (PMOLED) display and an active matrix organic light emitting diode (AMOLED) display. The implementation of the AMOLED display includes a manner of a low temperature poly-silicon (LTPS) backplane plus a fine metal mask (FMM), and a manner of an oxide backplane plus a white organic light emitting diode (WOLED) plus a color filter. The former is mainly applied to a small-sized panel which corresponds to a mobile phone and a mobile application; the latter is mainly applied to a large-sized panel which corresponds to applications such as a monitor and a television. At present, the manner of the LTPS backplane plus FMM has matured and achieved mass production.

SUMMARY

At least one embodiment of the present disclosure provides a mask plate, and the mask plate includes a first mask sheet and a second mask sheet. The mask sheet includes a first mask area located in a middle region of the first mask sheet and first peripheral areas located on both sides of the first mask area in a first direction, a thickness of the first mask area is less than a thickness of the first peripheral areas to form a first concave portion corresponding to the first mask area, in a plane where the first mask area is located and in a direction perpendicular to the first direction, a size of the first mask area is equal to a size of the first mask sheet; the second mask sheet includes a second mask area located in a middle region of the second mask sheet and second peripheral areas located on both sides of the second mask area in a second direction, a thickness of the second mask area is less than a thickness of the second peripheral areas to form a second concave portion corresponding to the second mask area, in a plane where the second mask area is located and in a direction perpendicular to the second direction, a size of the second mask area is equal to a size of the second mask sheet; the first direction intersects the second direction, and a surface of the first mask area facing the first concave portion and a surface of the second mask area facing the second concave portion are attached facing each other.

For example, in an embodiment of the present disclosure, the mask plate further includes a frame, the first mask area and the second mask area are located in an opening of the frame, and a portion of the frame extending in the first direction is connected to the first peripheral areas, a portion of the frame extending in the second direction is connected to the second peripheral areas.

For example, in an embodiment of the present disclosure, a sum of thicknesses of the first mask area and the second mask area is the same as a thickness of the first peripheral areas or the second peripheral areas.

For example, in an embodiment of the present disclosure, the thickness of the first mask area is the same as the thickness of the second mask area.

For example, in an embodiment of the present disclosure, the thickness of the first peripheral areas is the same as the thickness of the second peripheral areas.

For example, in an embodiment of the present disclosure, the first mask sheet includes a plurality of first strip-like mask sheets extending in the first direction and arranged in the second direction, the second mask sheet includes a plurality of second strip-like mask sheets extending in the second direction and arranged in the first direction.

For example, in an embodiment of the present disclosure, a size of the first mask area in the first direction is equal to a size of the second mask area in the first direction, a size of the second mask area in the second direction is equal to a size of the first mask area in the second direction.

For example, in an embodiment of the present disclosure, on an opposite side of the first concave portion of the first mask sheet, a surface of the first mask area is flush with a surface of the first peripheral areas; on an opposite of the second concave portion of the second mask sheet, a surface of the second mask area is flush with a surface of the second peripheral areas.

For example, in an embodiment of the present disclosure, the first direction is perpendicular to the second direction.

For example, in an embodiment of the present disclosure, one of the first mask sheet and the second mask sheet is an open mask sheet, the other of the first mask sheet and the second sheet is a fine metal mask sheet.

For example, in an embodiment of the present disclosure, a shape of each opening of the open mask sheet comprises at least one selected from the group consisting of a circle shape, an ellipse shape, a polygon shape and a fan shape.

At least one embodiment of the present disclosure provides a mask sheet, the mask sheet includes a mask area in a middle region of the mask sheet and peripheral areas on both sides of the mask area in a first direction, and a thickness of the mask area is less than a thickness of the peripheral areas to form a concave portion corresponding to the mask area, in a second direction perpendicular to the first direction, a size of the mask area is equal to a size of the mask sheet, the second direction is parallel to the mask sheet.

For example, in an embodiment of the present disclosure, the mask sheet is a fine metal mask sheet or an open mask sheet.

For example, in an embodiment of the present disclosure, the mask sheet is the open mask sheet, a shape of each opening of the open mask sheet comprises at least one selected from the group consisting of a circle shape, an ellipse shape, a polygon shape and a fan shape.

For example, in an embodiment of the present disclosure, on an opposite side of the concave portion of the mask sheet, a surface of the mask area is flush with a surface of the peripheral areas.

BRIEF DESCRIPTION OF THE DRAWINGS

In order to clearly illustrate the technical solution of embodiments of the present disclosure, the drawings of the embodiments or related technical description will be briefly described in the following; it is obvious that the drawings in the description are only related to some embodiments of the present disclosure and not limited to the present disclosure.

FIG. 1b is a sectional view of a mask plate along an AB direction illustrated in FIG. 1a;

FIG. 2b is a sectional view of a first mask sheet along an AB direction in FIG. 2a;

FIG. 2c is a sectional view of a second mask sheet along a CD direction in FIG. 2a;

FIG. 2d is a sectional view of a mask plate along an AB direction in FIG. 2a;

FIG. 3b is a sectional view of a mask sheet along an AB direction in FIG. 3a;

FIG. 4b is a sectional view of a mask sheet along a CD direction in FIG. 4a;

DETAILED DESCRIPTION

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used herein have the same meanings as commonly understood by one of ordinary skill in the art to which the present disclosure belongs. The terms "first", "second", etc., which are used in the description and the claims of the present disclosure, are not intended to characterize, any sequence, amount or importance, but distinguish various components. The terms "includes", "including", etc., are intended to specify that the elements or the objects stated before these terms encompass the elements or the objects and equivalents thereof listed after these terms, but do not preclude the other elements or objects. "On", "under", "right", "left" and the like are only used to indicate relative position relationship, and when the position of the object which is described is changed, the relative position relationship may be changed accordingly.

In a study, the inventors of the present application have found that in a stretching process, a metal mask plate of 1.4-inch watch (1.4 Watch) using a double-layer mask stretching process to directly weld a fine metal mask sheet (FMM sheet) on a surface of a welded open mask sheet.

Figure 1A:
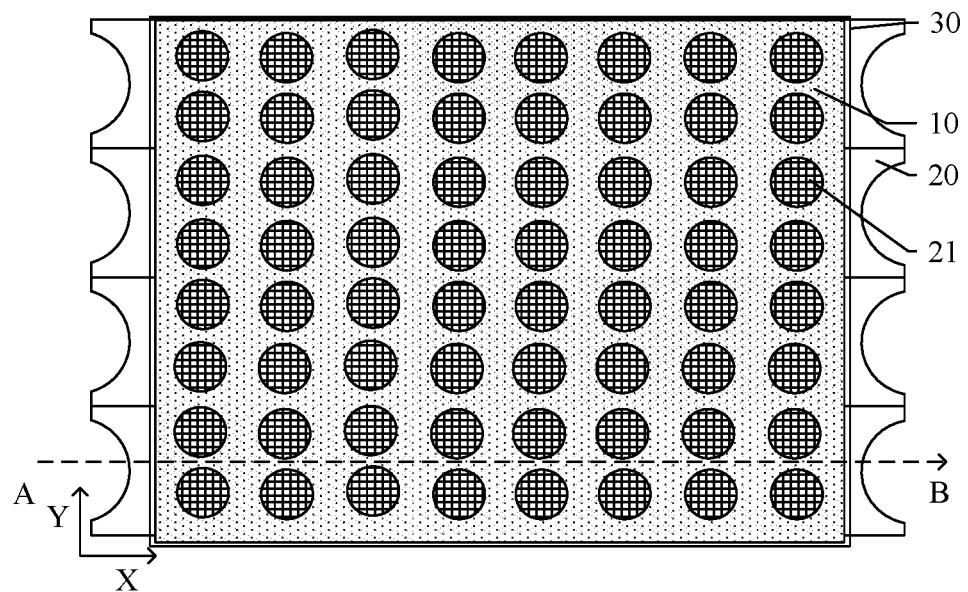
FIG. 1a is a view of a mask plate.

FIG. 1a is a view of a mask plate. As illustrated in FIG. 1a, the mask plate includes an open mask sheet 10, a fine metal mask sheet 20 and a frame 30. An opening shape of the open mask sheet 10 is in a shape of circular, a diameter of the opening shape is about 1.4 inch (3.55 cm), and the open mask sheet 10 is mainly applied to evaporation of a circular display panel (1.4 Watch). The through holes distributed in a mask area 21 of the fine metal mask sheet 20 are applied for evaporating pixels of the display panel.

In a practical use process, a precision of the fine metal mask sheet 20 is largely affected by the open mask sheet 10. A manufacturing process of the mask plate is usually as follows: the open mask sheet 10 is stretched and welded to the frame 30, weld points of the open mask sheet 10 are distributed around the frame 30, and then the fine metal mask sheet 20 is stretched in the X direction and welded on the open mask sheet 20.

Figure 1B:
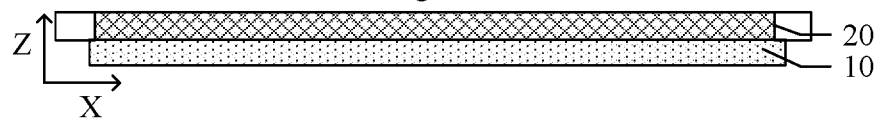

FIG. 1b is a sectional view of the mask plate along an AB direction illustrated in FIG. 1b. As illustrated in FIG. 1b, the fine metal mask sheet 20 is disposed on the open mask sheet 10, that is, the open mask sheet 10 is overlapped with the fine metal mask sheet 20 in Z direction, and an attaching degree between them is not good. A position precision of the open mask sheet 10 is greatly deviated, which leads to a case that a weld precision of the entire mask sheet is decreased, a large wrinkle is generated between the two mask sheets, therefore, an evaporation effect of the display panel is affected.

At least one embodiment of the present disclosure provides a mask plate which includes a first mask sheet and a second mask sheet. The first mask sheet includes a first mask area located in a middle region of the first mask sheet and first peripheral areas located on both sides of the first mask area in a first direction, and a thickness of the first mask area is less than a thickness of the first peripheral areas to form a first concave portion corresponding to the first mask area. In a plane where the first mask area is located and in a direction perpendicular to the first direction, a size of the first mask area is equal to a size of the first mask sheet. The second mask sheet includes a second mask area located in a middle region of the second mask sheet and second peripheral areas located on both sides of the second mask area, and a thickness of the second mask area is less than a thickness of the second peripheral areas to form a second concave portion corresponding to the second mask area. In a plane where the second mask area is located and in a direction perpendicular to the second direction, a size of the second mask area is equal to a size of the second mask sheet. The first direction intersects the second direction, and a surface of the first mask area facing the first concave portion and a surface of the second mask area facing the second concave portion are attached facing each other. The two mask sheets in the mask plate can be attached more closely, thereby effectively improving a welding precision, reducing wrinkles on a surface of the mask sheet, and reducing a shadow during the evaporation process, and then further improving production yield. Furthermore, the evaporation yield can be improved by decreasing the thickness of the mask area.

Hereinafter, the mask plate, the mask sheet and the manufacturing method of the mask plate provided by embodiments of the present disclosure will be described with reference to the accompanying drawings.

Figure 2A:
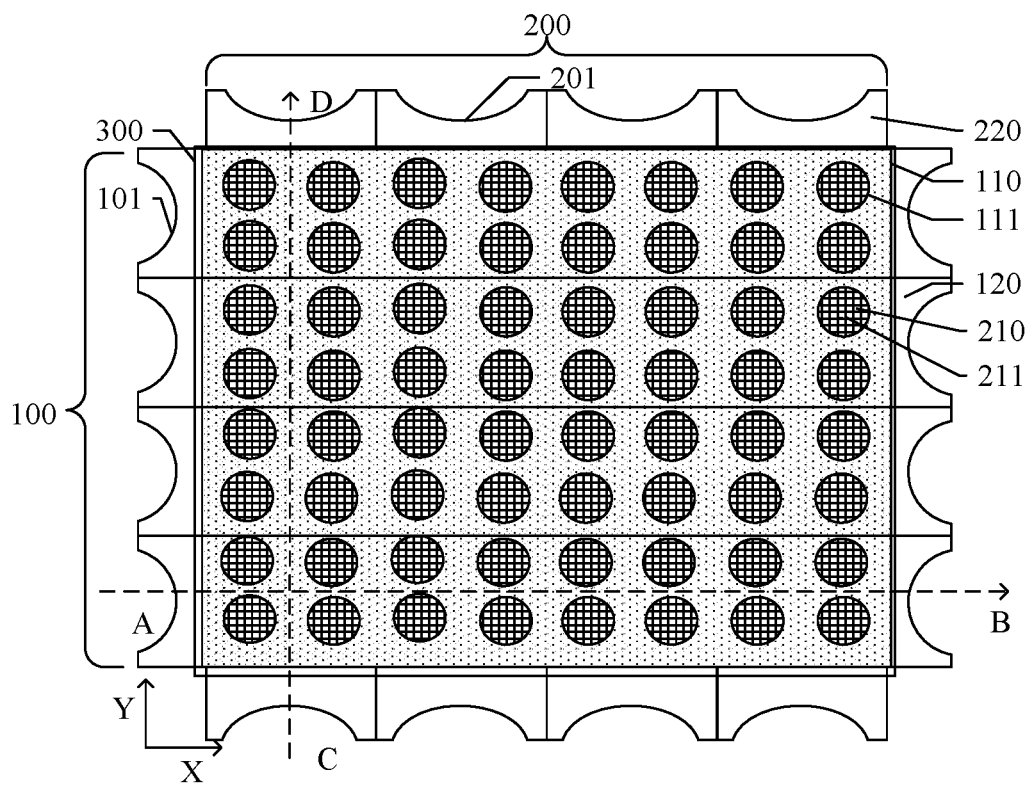
FIG. 2a is a view of a mask plate provided by an embodiment of the present disclosure.
Figure 2B:
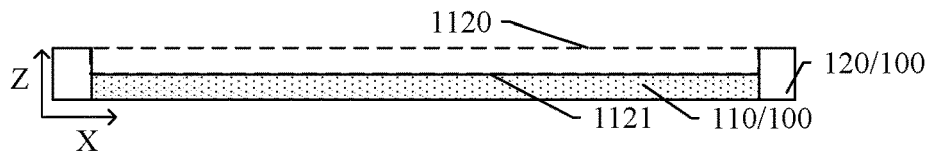
Figure 2C:
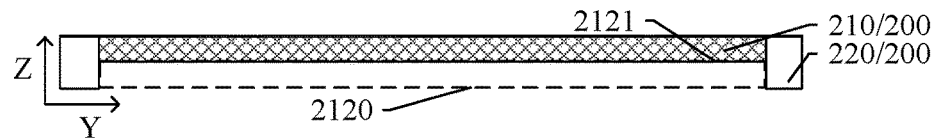
Figure 2D:
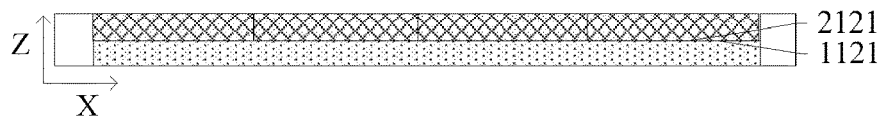

An embodiment of the present disclosure provides a mask plate, FIG. 2a is a view of the mask plate provided by the present embodiment, FIG. 2b is a sectional view of a first mask sheet long an AB direction in FIG. 2a, FIG. 2c is a sectional view of a second mask sheet along a CD direction in FIG. 2a, and FIG. 2d is a sectional view of the mask plate along the AB direction in FIG. 2a. As illustrated in FIG. 2a, the mask plate includes a first mask sheet 100 and a second mask sheet 200. The first mask sheet 100 includes a first mask area 110 located in a middle region of the first mask sheet 100 and first peripheral areas 120 located on both sides of the first mask area 110 in a first direction, that is, in the first direction, a size of the first mask sheet 100 is a sum of sizes of the first mask area 100 and two first peripheral areas 120. The present embodiment takes an example that the first direction is X direction illustrated in figures for description. In a plane where the first mask area 110 is located and in a direction perpendicular to the first direction, a size of the first mask area 110 is equal to a size of the first mask sheet 100. The second mask sheet 200 includes a second mask area 210 located in a middle region of the second mask sheet 200 and second peripheral areas 220 located on both sides of the second mask area 210 in a second direction, that is, in the second direction, a size of the second mask sheet 200 is a sum of sizes of the second mask area 210 and two second peripheral areas 220. The present embodiment takes an example that the second direction is Y direction illustrated in figures for description, and the first direction intersects the second direction. In a plane where the second mask area 210 is located and in a direction perpendicular to the second direction, a size of the second mask area 210 is equal to a size of the second mask sheet 200.

For example, the present embodiment takes an example that the first direction and the second direction are perpendicular to each other for description, and in the Y direction, the size of the mask area 110 is equal to the size of the first mask sheet 100; in the X direction, the size of the second mask area 210 is equal to the size of the second mask sheet 200. The present embodiment is not limited thereto, for example, the first direction can be not perpendicular to the second direction.

For example, as illustrated in FIG. 2*a*, the first mask sheet 100 is an open mask sheet, and the second mask sheet 200 is a fine metal mask sheet. The first mask area 110 includes a plurality of openings 111, which are configured to transmit an evaporation material to evaporate the display panel, and a shape and a size of the openings 111 are the same as those of the display panel to be evaporated, therefore the first mask sheet 100 can be used to evaporate a plurality of display panels. The second mask area 210 includes a plurality of through holes 211, which are configured to transmit the evaporation material to evaporate pixels in the display panel. The present embodiment is not limited thereto, for example, it can also be that the first mask sheet is a fine metal sheet, and the second mask sheet is an open mask sheet.

For example, each opening 111 of the plurality of openings 111 has the same shape and size. For example, the opening 111 can be a circular opening, a diameter of the circular opening is 1.4 inch, which is configured to evaporate the 1.4-inch circular watch (1.4 Watch), and the present embodiment includes but is not limited thereto. For example, the shape of the opening 111 can also include at least one of an ellipse shape, a polygon shape or a fan shape and so on, which is configured to evaporate the display panel in an irregular shape. It should be noted that, the shape and number of openings in FIG. 2*a* are only schematic and can be determined according to actual process needs.

For example, as illustrated in FIG. 2*b*, a thickness of the first mask sheet 100 located in the first mask area 110 in Z direction is less than a thickness of the first mask sheet 100 located in the first peripheral areas 120 in the Z direction to formed a first concave portion 1120 corresponding to the first mask area 110, that is, the first concave portion 1120 is formed in the middle region of the first mask sheet 100 in the X direction. The first concave portion 1120 is an area encircled by a dotted line in FIG. 2*b*.

For example, as illustrated in FIG. 2*c*, a thickness of the second mask sheet 200 located on the second mask area 210 in the Z direction is less than a thickness of the second mask sheet 200 located on the second peripheral areas 220 in the Z direction to form a second concave portion 2120, that is, the second concave portion 2120 is formed in the middle region of the second mask sheet in the Y direction. The second concave portion 2120 is an area encircled by a dotted line in FIG. 2*c*.

It should be noted that, FIG. 2*b* to FIG. 2*d* are only sectional views of the first mask sheet and the second mask sheet. FIG. 2*b* to FIG. 2*d* take an example that the second mask sheet 200 is located on the first mask sheet 100 for description, and FIG. 2*a* illustrates a case that the first mask sheet 100 in the mask plate is located below the second mask sheet 200, the Z direction is a direction perpendicular to the paper and points to an inside of the paper in FIG. 2*a*, therefore, the cooperation of the first mask sheet 100 and the second mask sheet 200 requires that a surface 1121 of the first mask area 110 facing the first concave portion 1120 and a surface 2121 of the second mask area 210 facing the second concave portion 2120 are attached facing each other.

For example, as illustrated in FIG. 2*d*, the surface 1121 of the first mask area 110 facing the first concave portion 1120 and the surface 2121 of the second mask area 210 facing the second concave portion 2120 are attached facing each other, that is, bottoms of the two concave portions are attached facing each other, so that the two mask sheets can be attached more closely, thereby effectively improving the welding precision. The two mask sheets are attached closely in the welding process, so as to reduce wrinkles and improve flatness on the surface of the mask sheets, so that the fine metal mask sheet can be more closely attached to a base substrate during the evaporation process, so as to reduce wrinkles on the surface and shadows in the evaporation, thereby improving evaporation yield.

For example, as illustrated in FIG. 2*a*, the mask plate provided by the present embodiment further includes a frame 300, and the first mask area 110 and the second mask area 210 are located in an opening of the frame 300. For example, the present embodiment takes an example that the shape of the frame 300 is rectangle for description, portions of two sides of the frame 300 parallel to the Y direction are connected to the first peripheral areas 120, portions of two sides of the frame 300 parallel to the X direction are connected to the second peripheral areas 220. For example, the first mask sheet 100 is stretched in the X direction, so that the first peripheral areas 120 distributed on both sides of the first mask area 110 in the X direction are respectively welded to the frame 300, the second mask sheet 200 is stretched in the Y direction, so that the second peripheral areas 220 distributed on both sides of the second mask area in the Y direction are respectively welded to the frame 300. Comparing with a case (a case illustrated in FIG. 1*a* and FIG. 1*b*) that the second mask sheet (fine metal mask sheet) is directly welded on the first mask sheet (open mask sheet), the second mask sheet 200 (fine metal mask sheet) in the present embodiment is directly welded on the frame 300, so that the two sheets can be more closely attached to each other, thereby improving the welding precision.

For example, as illustrated in FIG. 2*a*, the first mask sheet 100 includes a plurality of first strip-like mask sheets 101 extending in the X direction and arranged in the Y direction, that is, the first mask sheet 100 is formed by the plurality of first strip-like mask sheets 101 welded on the frame 300. The present embodiment takes an example that the first mask sheet 100 includes four first strip-like mask sheets 101 arranged in the Y direction for description, the present embodiment is not limited thereto, the number of the first strip-like mask sheets can be set according to the actual process. The second mask sheet 200 includes a plurality of second strip-like mask sheets 201 extending in the Y direction and arranged in the X direction, that is, the second mask sheet 200 is formed by the plurality of second strip-like mask sheets 201 welded on the frame 300. The present embodiment takes an example that the second mask sheet 200 includes four second strip-like mask sheets 201 arranged in the X direction for description, the present embodiment is not limited thereto, and the number of the second strip-like mask sheets can be set according to the actual process.

For example, as illustrated in FIG. 2a, the size of the first mask area 110 in the X direction is equal to the size of the second mask area 210 in the X direction, and the size of the second mask area 210 in the Y direction is equal to the size of the first mask area 110 in the Y direction. For example, in the X direction, a size of a first strip-like mask area included in each of the first strip-like mask sheets 101 is equal to a sum of sizes of a plurality of second strip-like mask areas included in the plurality of second strip-like mask sheets 201, and in the Y direction, a size of the second strip-like mask area included in each of the second strip-like mask sheets 201 is equal to a sum of sizes of a plurality of first strip-like mask areas included in the plurality of first strip-like mask sheets 101. Therefore, while ensuring that the first mask sheet and the second mask sheet are closely attached, the possibility that the two mask sheets relatively slide in each direction can be reduced, thereby improving the evaporation precision and production yield.

For example, as illustrated in FIG. 2b to FIG. 2d, the sum of the thicknesses of the first mask area 110 and the second mask area 210 is equal to the thickness of the first peripheral areas 120 or the second peripheral areas 220, that is, in the Z direction, the sum of the thickness of the first mask sheet 100 located on the first mask area 110 and the thickness of the second mask sheet 200 located on the second mask area 210 is equal to the thickness of the first mask sheet 100 located on the first peripheral areas 120 or the second mask sheet 200 located on the second peripheral areas 220.

For example, the thickness of the first peripheral areas 120 is the same as the thickness of the second peripheral areas 220, the present embodiment includes but is not limited thereto, for example, the thickness of the first peripheral areas 120 can also be different from the thickness of the second peripheral areas 220.

For example, as illustrated in FIG. 2d, the thickness of the first mask area 110 is the same as the thickness of the second mask area 210, and the present embodiment includes but is not limited thereto.

For example, as illustrated in FIGS. 2b to 2d, on an opposite side of the first concave portion 1120 of the first mask sheet 100, a surface of the first mask area 110 is flush with a surface of the first peripheral areas 120, that is, a surface of the first mask area 110 away from the second mask sheet 200 is flush with a surface of the first peripheral areas 120 away from the second mask sheet 200 in the X direction. Therefore, a surface of the first mask sheet 100 away from the second mask sheet 200 is a plane. On an opposite of the second concave portion 2120 of the second mask sheet 200, a surface of the second mask area 210 is flush with a surface of the second peripheral areas 220, that is, a surface of the second mask area 210 away from the first mask sheet 100 is flush with a surface of the second peripheral areas 220 away from the first mask sheet 100 in the Y direction. Therefore, a surface of the second mask sheet 200 away from the first mask sheet 100 is a plane.

For example, as illustrated in FIG. 2d, in the present embodiment, upon the thickness of the first peripheral areas 120 being the same as the thickness of the second peripheral areas 220, and the sum of the thicknesses of the first mask area 110 and the second mask area 210 being the same as the thickness of the first peripheral areas 120 (the second peripheral areas 220), the entire mask plate in the Z direction has the same thickness, and the upper surface and the lower surface are planes. Therefore, in the evaporation process, the mask plate can be closely attached to the base substrate so as to improve the evaporation yield. In addition, comparing with a case that the thickness of a normal mask plate is a lamination of the thicknesses of peripheral areas of the two mask sheets, the thickness of the two mask plate provided by the present embodiment is a lamination of the thickness of mask areas of the two mask sheets or the thickness of the peripheral areas of one mask sheet, thereby decreasing the thickness of the mask plate located on the mask areas to improve the evaporation precision.

For example, the material of the mask plate includes invar alloy. For example, the invar alloy is an iron alloy containing 35.4% nickel, which has advantages of resistance of high temperature and high pressure, low coefficient of thermal expansion and being not easily deformed and so on, as compared to other materials, and the invar alloy can maintain a fixed length in a wide temperature range.

Figure 3A:
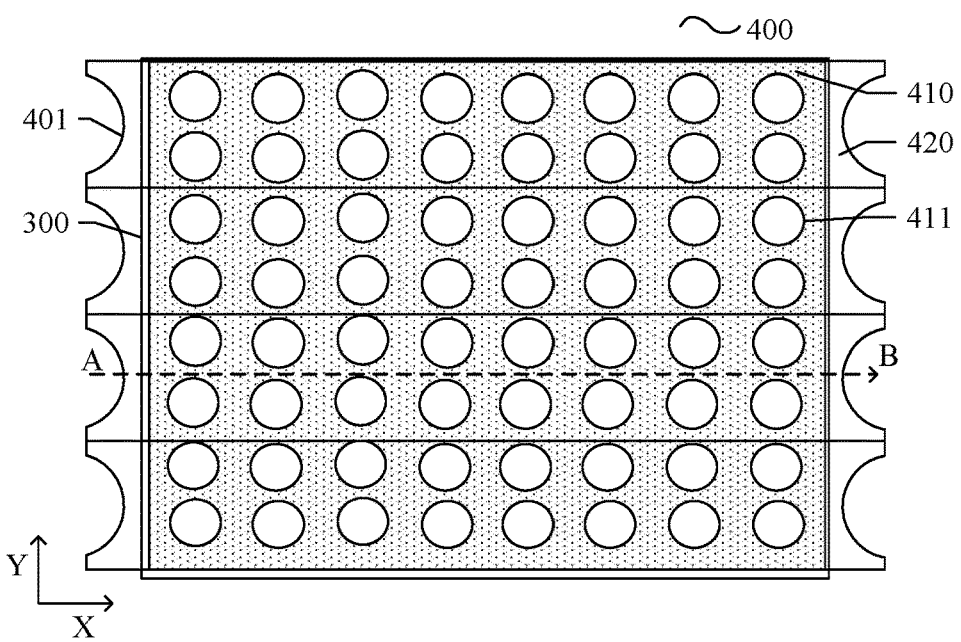
FIG. 3a is a view of mask sheet provided by an embodiment of the present disclosure.
Figure 3B:
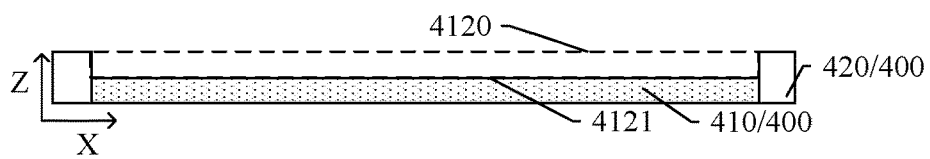

Another embodiment of the present disclosure provides a mask sheet, FIG. 3a is a view of the mask sheet provided by the present embodiment, FIG. 3b is a sectional view of the mask sheet along an AB direction. As illustrated in FIG. 3a, the mask sheet 400 includes a mask area 410 in a middle region of the mask sheet 400 and peripheral areas 420 on both sides of the mask sheet 400 in a first direction, that is, in the first direction, a size of the mask sheet 400 is a sum of sizes of the mask area 410 and two peripheral areas 420. In a plane where the mask area 410 is located and in a second direction perpendicular to the first direction, the size of the mask area 410 is equal to a size of the mask sheet 400. The present embodiment takes an example that the first direction is X direction illustrated in FIG. 3a, and the second direction is Y direction illustrated in FIG. 3a for description, but not limited thereto.

As illustrated in FIG. 3b, the thickness of the mask area 410 is less than the thickness of the peripheral areas 420 to form a concave portion 4120 corresponding to the mask area 410, that is, in Z direction, a thickness of the mask sheet 400 located on the mask area 410 is less than a thickness of the mask sheet 400 located on the peripheral areas 420 to form the concave portion 4120 in the middle region of the mask sheet 400. For example, on an opposing side of the concave portion 4120 of the mask sheet 400, a surface of the mask area 410 is flush with a surface of the peripheral areas 420.

For example, as illustrated in FIG. 3a, the mask sheet 400 provided by the present embodiment further includes a frame 300, and the mask area 410 is located in an opening of the frame 300. For example, the frame 300 has a shape of rectangular, portions of two sides of the frame 300 parallel to the Y direction are connected to the peripheral areas 420. That is, the mask sheet 400 is stretched in the X direction, so that the peripheral areas 420 distributed on both sides of the mask areas in the X direction are respectively welded to the frame 300.

For example, as illustrated in FIG. 3a, the mask sheet 400 includes a plurality of strip-like mask sheets 401 extending in the X direction and arranged in the Y direction, that is, the mask sheet 400 is formed by the plurality of strip-like mask sheets 401 welded on the frame 300. The present embodiment takes an example that the mask sheet 400 includes four strip-like mask sheets 401 arranged in the X direction for description, the present embodiment is not limited thereto, and the number of the strip-like mask sheets can be set according to the actual process.

For example, FIG. 3a takes an example that the mask sheet 400 is an open mask sheet for description, the mask area 410 includes a plurality of openings 411, which are configured to transmit an evaporation material to evaporate the display panel, and a shape and a size of the openings 411 are the same as those of the display panel to be evaporated, therefore the mask sheet 400 can be used to evaporate a plurality of display panels.

For example, each opening 411 of the plurality of openings 411 has the same shape and size. For example, the opening 411 can be a circular opening, a diameter of the circular opening is 1.4 inch, which is configured to evaporate the 1.4-inch circular watch (1.4 Watch), and the present embodiment includes but is not limited thereto. For example, the shape of each opening 411 of the mask sheet can also include at least one of an ellipse shape, a polygon shape or a fan shape and so on, which is configured to evaporate the display panel in an irregular shape. It should be noted that, the shape and number of openings in FIG. 3a are only schematic and can be determined according to actual process needs.

Figure 4A:
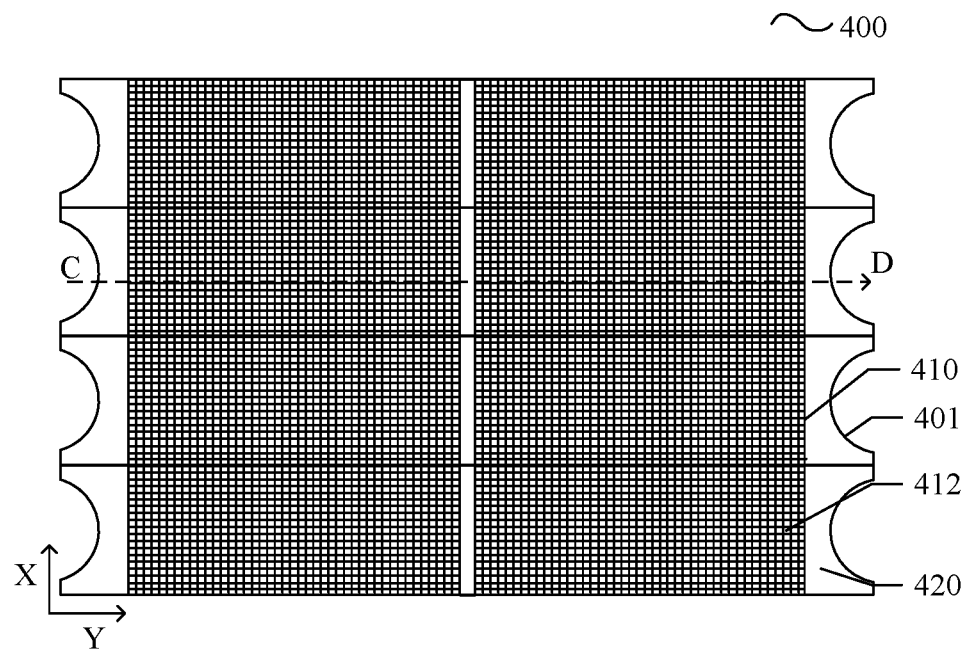
FIG. 4a is a view of another mask sheet provided by an embodiment of the present disclosure.
Figure 4B:
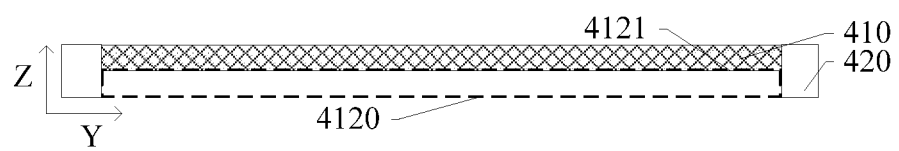

For example, FIG. 4a is a view of another mask sheet provided by the present embodiment, FIG. 4b is a sectional view of the mask sheet along a CD direction in FIG. 4a. As illustrated in FIG. 4a and FIG. 4b, the mask sheet 400 is a fine metal mask sheet, and the mask area 410 includes a plurality of through holes 412, which are configured to evaporate pixels of the display panel. It should be noted that, upon the mask sheet 400 being a fine metal mask sheet, the first direction is the Y direction illustrated in FIG. 4a, the second direction is the X direction illustrated in FIG. 4a. A white strip in the mask area 410 in FIG. 4a serves as a boundary line, dividing the mask area 410 into two mask areas in the Y direction, the present embodiment is not limited thereto, and the mask area 400 can also not have the boundary line.

The mask sheet provided by the present embodiment can be the open mask sheet illustrated in FIG. 3b or the fine metal mask sheet illustrated in FIG. 4b, in the present embodiment, surfaces 4121 of the two mask areas 410 in the open mask sheet and the fine metal mask sheet which include the concave portions 4120 facing the concave portion 410 are attached facing each other, so as to improve tightness of the two mask sheets, reduce wrinkles and improve flatness on the surface of the mask sheets, so that the fine metal mask sheet can be more closely attached to the base substrate during the evaporation process, so as to reduce wrinkles on the surface of the mask sheets and shadows in the evaporation, thereby improving the evaporation yield.

Figure 5A:
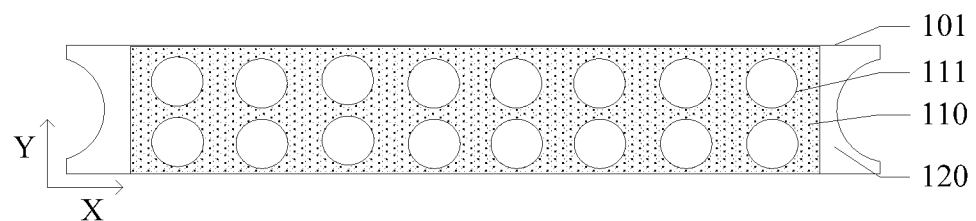
FIG. 5a-FIG. 5c are flow charts of a manufacturing method of a mask plate provided by an embodiment of the present disclosure.
Figure 5B:
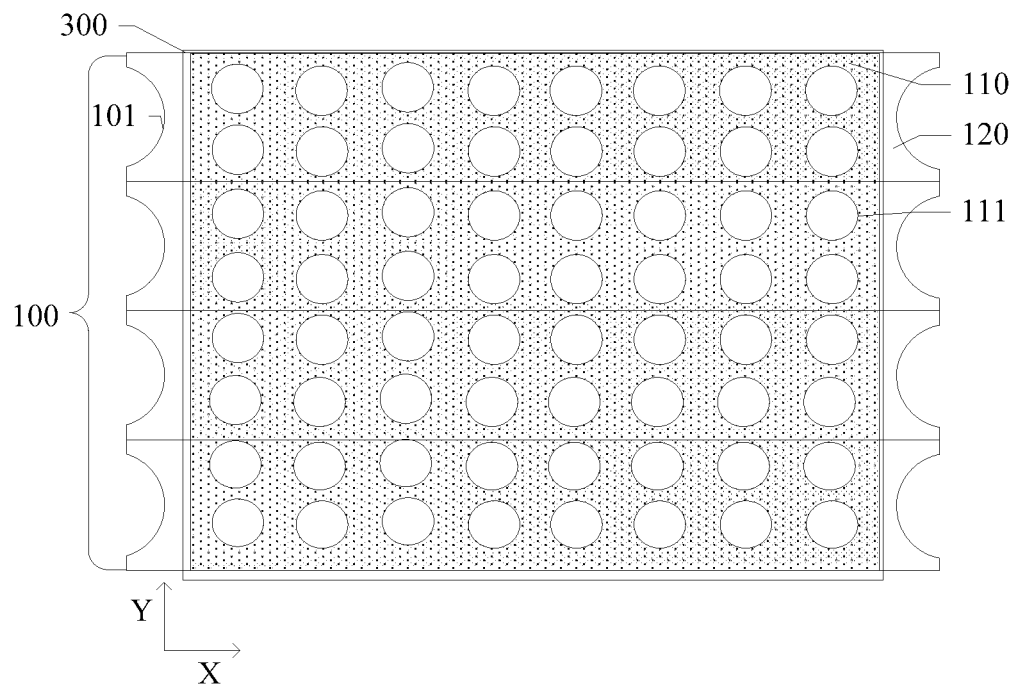
Figure 5C:
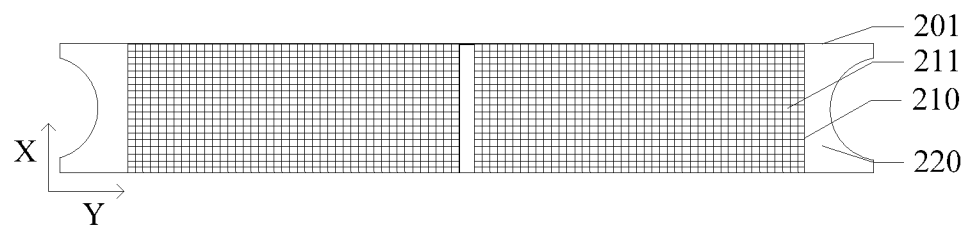

Another embodiment of the present disclosure provides a manufacturing method of the mask plate provided by the abovementioned embodiments, FIG. 5a to FIG. 5c are views of the mask sheet included in a process flow of a manufacturing method of the mask plate.

For example, as illustrated in FIG. 5a, a plurality of first strip-like mask sheets 101 are provided, each of the first strip-like mask sheets 101 includes a first mask area 110 in a middle region of a first strip-like mask sheet 101 and first peripheral areas 120 located on both sides of the first strip-like mask area 110 in X direction. The first strip-like mask sheet 101 are upper half etched to form the first strip-like sheet 101 having a sectional shape as illustrated in FIG. 2b, that is, a thickness of the first strip-like mask sheet 101 located on the first mask area 110 is reduced by the upper half etching, but a thickness of the first strip-like mask sheet 101 located on the first peripheral areas 120 is not changed, so that the thickness of the first peripheral areas 120 is greater than the thickness of the first mask area 101 in the first strip-like mask sheet 101 to form a first concave portion 1120. In addition, in the Y direction, a size of the first mask area 110 is equal to a size of the first strip-like mask sheet 101.

For example, the present embodiment takes an example that the first strip-like mask sheet 101 is an open mask sheet for description, but not limited thereto. For example, the first mask area 110 in the first strip-like mask sheet 101 includes a plurality of openings 111, which are configured to transmit an evaporation material to evaporate the display panel, and a shape and a size of the openings 111 are the same as those of the display panel to be evaporated, therefore the first strip-like mask sheet 101 can be used to evaporate a plurality of display panels.

For example, the shape of each opening 111 of the open mask sheet is not limited to the circular as illustrated in FIG. 5a, the shape of the opening 111 can also include at least one of an ellipse shape, a polygon shape or a fan shape and so on, which is configured to evaporate the display panel in an irregular shape. It should be noted that, the shape and number of the openings in FIG. 5a are only schematic and can be determined according to actual process needs.

For example, as illustrated in FIG. 5b, the plurality of first strip-like mask sheets 101 are stretched in the X direction, and welded on a frame 300 in sequence. The present embodiment takes an example that four first strip-like mask sheets 101 are welded on the frame in the Y direction for description, the present embodiment is not limited thereto, and the number of the first strip-like mask sheets are set according to the actual process.

For example, as illustrated in FIG. 5c, a plurality of second strip-like mask sheets 210 are provided, each of the second strip-like mask sheets 201 includes a second mask area 210 in a middle region of a second strip-like mask sheet 201 and second peripheral areas 220 located on both sides of the second strip-like area sheet 210 in Y direction. It should be noted that, the present embodiment takes an example that the X direction and the Y direction are perpendicular to each other for description, but not limited thereto, the X direction can be not perpendicular to the Y direction. The second strip-like mask sheet 201 is lower half etched to form the second strip-like sheet 201 having a sectional shape as illustrated in FIG. 2c, that is, a thickness of the second strip-like mask sheet 201 located on the second mask area 210 is reduced by the lower half etching, but a thickness of the second strip-like mask sheet 201 located on the second peripheral areas 120 is not changed, so that the thickness of the second peripheral areas 120 is greater than the thickness of the second mask area 201 in the second strip-like mask sheet 201 to form a second concave portion 2120. In addition, in the X direction, a size of the second mask area 210 is equal to a size of the second strip-like mask sheet 201.

For example, the present embodiment takes an example that the second strip-like mask sheets 201 are fine metal mask sheets for description, and the second mask area 210 includes a plurality of through holes 211, which are configured to transmit evaporation materials to evaporate pixels in the display panel.

For example, the plurality of second strip-like mask sheets 201 are stretched in the Y direction, and welded on the frame 300 in sequence to form the mask plate illustrated in FIG. 2a. In a process of welding the plurality of second strip-like mask sheets 201, a surface 1121 of the first mask area 110 facing the first concave portion 1120 and a surface 2121 of the second mask area 210 facing the second concave portion 2120 are attached facing each other to improve tightness of the two mask sheets, thereby improving the evaporation precision. The two mask sheets are closely attached in the welding process, which can reduce wrinkles and improve flatness on the surface of the mask sheets, so that the fine metal mask sheet can be more closely attached to the base substrate during the evaporation process, so as to reduce wrinkles on the surface of the mask sheets and shadows in the evaporation, thereby improving the evaporation yield.

It should be noted that, features such as the shape and material of the mask plate made by the present embodiment are the same as those of the mask plate provided by the abovementioned embodiments, which is not repeated herein.

The following points should to be explained:

(1) Unless otherwise defined, in the embodiments and accompanying drawings in the present disclosure, the same reference numeral represents the same meaning.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, a layer or a structure may be enlarged. It should understood that, in the case in which a component or element such as a layer, film, area, substrate or the like is referred to be "on" or "under" another component or element, it may be "directly" on or under the another component or element or a component or element is interposed therebetween.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A mask plate, comprising:
   a first mask sheet, comprising a first mask area located in a middle region of the first mask sheet and first peripheral areas located on both sides of the first mask area in a first direction, a thickness of the first mask area is less than a thickness of the first peripheral areas to form a first concave portion corresponding to the first mask area, in a plane where the first mask area is located and in a direction perpendicular to the first direction, a size of the first mask area is equal to a size of the first mask sheet; and
   a second mask sheet, comprising a second mask area located in a middle region of the second mask sheet and second peripheral areas located on both sides of the second mask area in a second direction, a thickness of the second mask area is less than a thickness of the second peripheral areas to form a second concave portion corresponding to the second mask area, in a plane where the second mask area is located and in a direction perpendicular to the second direction, a size of the second mask area is equal to a size of the second mask sheet,
   wherein the first direction intersects the second direction, and a surface of the first mask area facing the first concave portion and a surface of the second mask area facing the second concave portion are attached facing each other.

2. The mask plate according to claim 1, further comprising:
   a frame, wherein the first mask area and the second mask area are located in an opening of the frame, and a portion of the frame extending in the second direction is connected to the first peripheral areas, a portion of the frame extending in the first direction is connected to the second peripheral areas.

3. The mask plate according to claim 1, wherein a sum of thicknesses of the first mask area and the second mask area is the same as a thickness of the first peripheral areas or the second peripheral areas.

4. The mask plate according to claim 1, wherein the thickness of the first mask area is the same as the thickness of the second mask area.

5. The mask plate according to claim 1, wherein the thickness of the first peripheral areas is the same as the thickness of the second peripheral areas.

6. The mask plate according to claim 1, wherein the first mask sheet comprises a plurality of first strip-like mask sheets extending in the first direction and arranged in the second direction, the second mask sheet comprises a plurality of second strip-like mask sheets extending in the second direction and arranged in the first direction.

7. The mask plate according to claim 1, wherein a size of the first mask area in the first direction is equal to a size of the second mask area in the first direction, a size of the second mask area in the second direction is equal to a size of the first mask area in the second direction.

8. The mask plate according to claim 1, wherein, on an opposite side of the first concave portion of the first mask sheet, a surface of the first mask area is flush with a surface of the first peripheral areas; on an opposite of the second concave portion of the second mask sheet, a surface of the second mask area is flush with a surface of the second peripheral areas.

9. The mask plate according to claim 1, wherein the first direction is perpendicular to the second direction.

10. The mask plate according to claim 1, wherein one of the first mask sheet and the second mask sheet is an open mask sheet, the other of the first mask sheet and the second mask sheet is a fine metal mask sheet.

11. The mask plate according to claim 10, wherein a shape of each opening of the open mask sheet comprises at least one selected from the group consisting of a circle shape, an ellipse shape, a polygon shape and a fan shape.

12. A mask sheet, comprising:
    a mask area in a middle region of the mask sheet and peripheral areas on both sides of the mask area in a first direction,
    wherein a thickness of the mask area is less than a thickness of the peripheral areas to form a concave portion corresponding to the mask area, in a second direction perpendicular to the first direction, a size of the mask area is equal to a size of the mask sheet, the second direction is parallel to the mask sheet.

13. The mask sheet according to claim 12, wherein the mask sheet is a fine metal mask sheet or an open mask sheet.

14. The mask sheet according to claim 13, wherein the mask sheet is the open mask sheet, a shape of each opening of the open mask sheet comprises at least one selected from the group consisting of a circle shape, an ellipse shape, a polygon shape and a fan shape.

15. The mask sheet according to claim 12, wherein on an opposite side of the concave portion of the mask sheet, a surface of the mask area is flush with a surface of the peripheral areas.

16. The mask plate according to claim 10, wherein the open mask sheet includes of at least one opening, the fine metal mask sheet includes through holes, and each opening in the open mask corresponds to a plurality of through holes in the fine metal mask.

* * * * *